United States Patent [19]

Amelio

[11] 4,139,787
[45] Feb. 13, 1979

[54] LINE-ADDRESSABLE RANDOM-ACCESS MEMORY DECOUPLING APPARATUS

[75] Inventor: Gilbert F. Amelio, Saratoga, Calif.

[73] Assignee: Fairchild Camera and Instrument Corporation, Mountain View, Calif.

[21] Appl. No.: 840,871

[22] Filed: Oct. 11, 1977

[51] Int. Cl.² ............................ G11C 7/00; H03K 5/18
[52] U.S. Cl. .................................... 307/264; 307/243; 307/364; 307/DIG. 1; 307/DIG. 3; 365/208; 365/220
[58] Field of Search ............... 307/204, 208, 219, 241, 307/242, 243, 254, 255, 270, 264, 355, 357, 364, 221 D, DIG. 1, DIG. 3; 357/24; 365/183, 205, 207, 208, 220, 222

[56] References Cited

U.S. PATENT DOCUMENTS

| | | | |
|---|---|---|---|
| 3,597,626 | 8/1971 | Heightley | 307/357 X |
| 3,663,887 | 5/1972 | Dix | 307/DIG. 3 X |
| 3,714,465 | 1/1973 | Skrenes | 307/357 |
| 3,764,826 | 10/1973 | Okada | 307/357 |
| 3,819,953 | 6/1974 | Puckette et al. | 307/242 X |
| 3,904,977 | 9/1975 | Barsotti | 307/243 X |
| 3,983,413 | 9/1976 | Gunsagar et al. | 307/355 |
| 4,020,364 | 4/1977 | Kuijk | 307/242 |
| 4,024,512 | 5/1977 | Amelio et al. | 307/221 D X |
| 4,084,256 | 4/1978 | Engeler et al. | 307/221 D X |

*Primary Examiner*—Larry N. Anagnos
*Attorney, Agent, or Firm*—Alan H. MacPherson; Robert C. Colwell

[57] ABSTRACT

A decoupling apparatus for a charge-coupled device line-addressable random-access memory includes a series of bipolar transistors, the bases of which are connected to output lines from the CCD LARAM. The emitters of the bipolar transistors, connected together, are connected to the source of a depletion-mode MOS reset transistor and to a comparator circuit.

11 Claims, 4 Drawing Figures

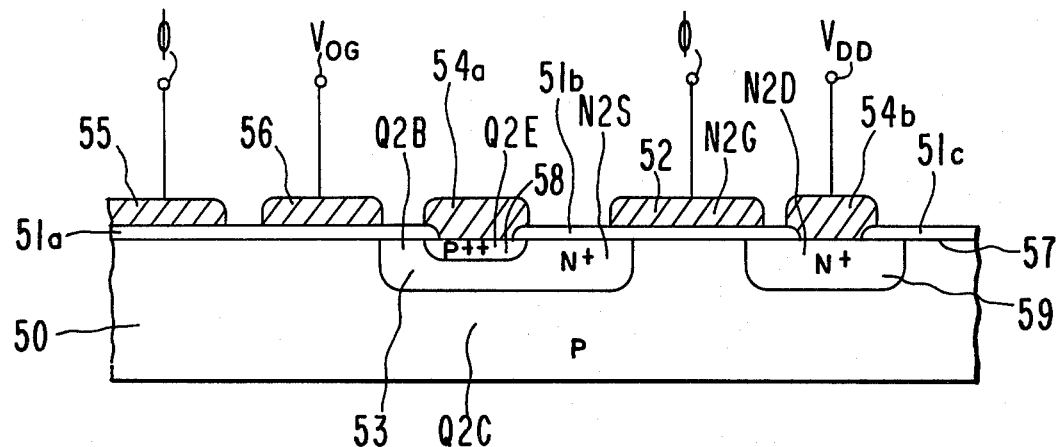
FIG. 2
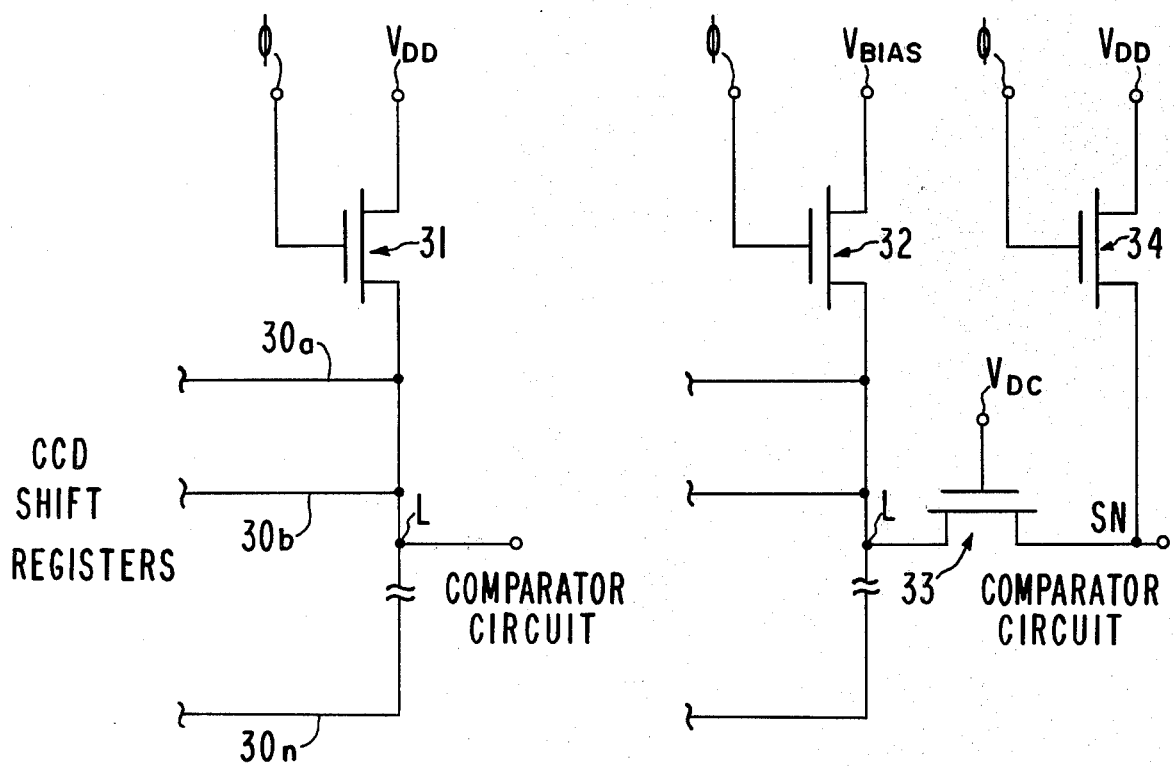
FIG. 3A
PRIOR ART
FIG. 3B
PRIOR ART

LINE-ADDRESSABLE RANDOM-ACCESS MEMORY DECOUPLING APPARATUS

BACKGROUND OF THE INVENTION

(1) Field of the Invention

This invention relates to semiconductor structures and circuits, and in particular to a decoupling circuit for a charge-coupled line-addressable random-access memory.

(2) Prior Art

The development of charge-coupled devices (referred to hereinafter as CCD's) has been described in numerous articles and technical publications. See, for example, the article by Gilbert F. Amelio entitled "Charge-Coupled Devices," published in the February 1974 *Scientific American*, Vol. 230, No. 2; and *Charge Transfer Devices*, by Sequin and Tompsett, published by the Academic Press in 1975. It is possible in the CCD art to fabricate long shift registers having stages consisting of individual charge-storage elements. Such shift registers may be used in area image sensors, analog delay lines or line scan arrays. When strings of charge-storage elements are organized in a parallel format and additional circuitry is provided for addressing, writing, or reading out information, such arrangements of CCD elements may be utilized as essentially random-access memories.

The organization of line-addressable random-access memory (hereinafter LARAM) is like that of a random-access memory except that lines of charge-coupled elements are accessible rather than individual bits of information. Although for this reason a LARAM does not allow true random-access to every bit in every shift register, the circulation of bits within a given shift register may be conducted at such high frequencies, for example five to ten megaHertz, that actual access time to any one element within a shift register can be on the order of microseconds. The exact access time depends on the length of the shift register and the particular clock frequency with which the elements are transferred. A more detailed explanation of a line-addressable random-access memory may be found in U.S. Pat. No. 4,024,512, issued to Gilbert F. Amelio and assigned to Fairchild Camera and Instrument Corporation, the assignee of this invention.

One of the difficulties of prior-art LARAM's has been the decoupling of the shared output diode with its large capacitance loading from the sense node of a comparator circuit used to interpret the output signals as either logical zeros or ones. A prior-art comparator circuit is shown in FIG. 6 of the U.S. Pat. No. 4,024,512, mentioned above.

Two prior-art approaches to sensing the CCD output charge are direct coupling and coupling through an MOS transmission device, as shown in FIGS. 3A and 3B, respectively. In FIG. 3A, an example of direct coupling between the output diode and the sense node, the charge from the CCD storage elements is transferred by shift registers (not shown) connected to output lines 30a, 30b, ... 30n to a source, or output diode, of transistor 31. The signal then appears as a voltage shift at terminal L. The change in voltage due to the presence of a signal on one of the CCD output lines will be given by:

$$\Delta V = Q_{signal}/C_L$$

where $Q_{signal}$ is the signal charge and $C_L$ is the capacitance at terminal L. Because $C_L$ typically is large (on the order of several hundred femtofarads), the change in voltage $\Delta V$ caused by a signal on one of the CCD lines will be small. A small $\Delta V$ is undesirable as it necessitates a sensitive, more complex, and hence, by virtue of yield, expensive, comparator circuit to obtain reliable performance in the decoding of CCD signals.

FIG. 3B shows the second prior-art technique for decoupling the sense node from the output diode, which is to connect the source and drain of an MOS transistor 33 between the shared output diode (source of transistor 32) and the sense node SN of the comparator circuit. The gate of transistor 33 is connected to a constant voltage source to place transistor 33 at turnoff when no signal is present. The appearance of signal charge at point L will turn on transistor 33 allowing $Q_{signal}$ to transfer to SN. In the ideal case, the change in voltage resulting from the presence of a CCD signal can be represented by:

$$\Delta V = Q_{signal}/C_{SN}$$

where $C_{SN}$ is the capacitance at terminal SN and $C_{SN} << C_L$. Unfortunately, such circuits, although providing a significantly larger change in voltage at the sense node of the comparator circuit as a result of the presence of a signal from the CCD device, are slow in operation. The slowness is caused by the necessity of operating MOS transistor 33 very near its turnoff point where its transconductance is very low.

SUMMARY OF THE INVENTION

Apparatus for decoupling the output diodes of a series of output lines from a line-addressable random-access memory from the sense node of a comparator circuit includes a series of bipolar and MOS transistors. Each base in the series of bipolar transistors is connected both to a respective output diode and to a corresponding one of reset MOS devices N1, ... Nn, with the collectors of the bipolar transistors connected to ground. The emitters of each of the bipolar transistors are connected together and to the sense node of the comparator circuit, to which may also be connected the source of an MOS depletion-mode transistor. The bipolar transistors, configured in an emitter-follower arrangement, decouple the output signals on the CCD output lines from the large capacitance of the shared input terminal to the comparator circuit. The apparatus of this invention facilitates faster and more sensitive detection of charge presented by the CCD to the comparator circuit, thereby improving the performance of the LARAM. It results in a larger voltage swing at the sense node of the comparator circuit, and operates faster than MOS decoupling circuits.

A further advantage of the circuit of this invention is that only one additional fabrication step beyond those required to form the LARAM itself is necessary. This is the formation, typically by ion implantation or diffusion processes, of the emitters of the bipolar transistors.

BRIEF DESCRIPTION OF THE DRAWINGS

FIG. 2 is a cross-sectional view of an integrated circuit structure fabricated according to this invention.

FIG. 3A is an example of a prior-art LARAM decoupling apparatus in which the output diodes were directly connected to the comparator circuit.

FIG. 3B is an example of a prior-art apparatus in which the output diodes were connected through an MOS device to the comparator circuit.

DETAILED DESCRIPTION

Figure 1:
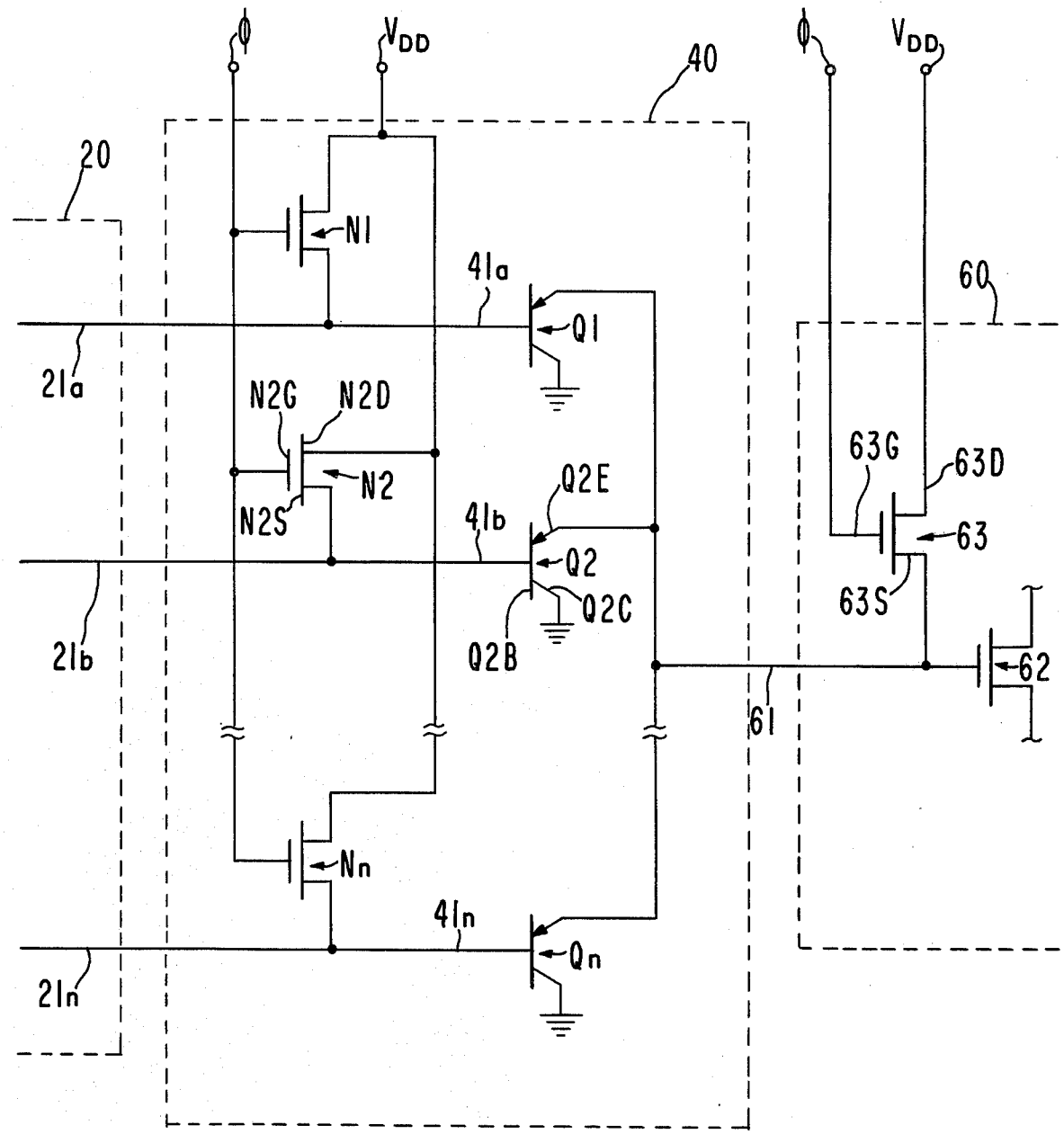
FIG. 1 is a circuit schematic of one embodiment of this invention.

FIG. 1 is a schematic diagram of one embodiment of the circuit 40 of this invention, shown connected between a portion of a LARAM 20 and a comparator circuit 60. Because circuit 20 and circuit 60 are well known in the semiconductor arts, they are only briefly discussed herein. Circuit 20 includes a series of n output lines, designated lines 21a, 21b, ... 21n from a line-addressable random-access memory, where n may be any integer, but is typically on the order of 16. Each of lines 21a, 21b, ... 21n is connected to the output from a string of shift register elements, for example, as disclosed in U.S. Pat. No. 4,024,512, discussed above, the contents of which are incorporated herein by reference. The strings of shift register elements may be used as an essentially random-access memory. Lines 21a, ... 21n are also connected to the respective sources of a series of MOS transistors N1 ... Nn. In response to clocking signals supplied to the strings of shift register elements, signals are presented to the sources of MOS transistors N1, N2, ... Nn for detection, amplification or other use. If circuit 20 is being used as a memory, then it will be desired to interpret the signals appearing on lines 21a, 21b, ... 21n as either logical zeros or ones. The interpretation of each signal as a zero or a one is accomplished by comparator circuit 60. One such comparator circuit is shown in FIG. 6 of U.S. Pat. No. 4,024,512. Comparator circuits typically include at least two MOS transistors 62 and 63, the current through transistor 62 being modulated by the presence or absence of signals on line 61. To decouple the outputs of the CCD registers and the sources of transistors N1 ... Nn from the large capacitance which appears on line 61 at the input terminal of comparator circuit 60, the circuit 40 shown in FIG. 1 is provided.

Circuit 40 includes a series of bipolar transistors Q1, Q2, ... Qn and a series of MOS transistors N1, N2 ... Nn. The lines 21a, 21b, ... 21n from circuit 20 are connected to input lines 41a, 41b, ... 41n of decoupling circuit 40, where n is as defined above. The input lines 41a, 41b ... 41n of decoupling circuit 40 are connected to the bases of bipolar transistors Q1, Q2, ... Qn. Vertical PNP bipolar transistors have been found particularly suitable for transistors Q1, Q2, ... Qn although lateral or other types of bipolar transistors also may be used. The emitters of the bipolar transistors are connected together and connected to the input line 61 of comparator circuit 60. Line 61 is also connected to the source 63S of an MOS transistor 63. The MOS transistor gate 63G is connected to a clock signal $\theta$, while the drain 63D of MOS transistor 63 is connected to a voltage source providing a potential $V_{DD}$. Typically, the clock signal $\theta$ will be the same clock signal which is supplied to the gates of transistors N1, N2, ... Nn in the circuit 20, while the bias voltage applied to the drain 63D of MOS transistor 63 typically will be the same as that applied to the drains of transistors N1, N2, ... Nn.

In operation, when signal $\theta$ is high, that is, at approximately the same level as $V_{DD}$, the bases of transistors Q1, Q2, ... Qn will be charged to potential $V_{DD}$, by the MOS transistors N1, N2 ... Nn, respectively. N1, N2, ... Nn are typically depletion-mode, n-channel MOS transistors, although other types may be utilized. At the same time as the bases of transistors Q1, ... Qn are precharged to $V_{DD}$, the input line 61 to comparator circuit 60 also will be precharged to the same voltage level by a similar MOS transistor 63.

When signal $\theta$ switches to a low level, usually approximately 0 volts, the gate-to-source overlap capacitance $C_o$ of devices N1, ... Nn causes the base voltage to drop from $V_{DD}$ to approximately $V_{DD}[1 - (C_o/C_B)]$, where $C_B$ is the base capacitance. Similarly, the input to comparator circuit 60 on line 61 will also drop from $V_{DD}$ to $V_{DD}[1 - (C'_o/C_L)]$, where $C'_o$ is the gate-to-source overlap capacitance of transistor 63 and $C_L$ is the input capacitance of the comparator circuit 60. In practice, however, the input capacitance $C_L$ of comparator circuit 60 typically will be greater than the base capacitance $C_B$, and hence the base will drop in voltage more than the common emitters of transistors Q1, Q2 ... Qn. By appropriately selecting the circuit elements utilized, in a manner as hereinafter set forth, transistors Q1, ... Qn can be made to just begin to turn on in response to $\theta$ going low. Thus, if charge emerges from one of the CCD registers connected to lines 21a, 21b, ... 21n, the base voltage of that particular transistor Q1, ... Qn will be further reduced, and the common emitters will follow the base as is well known.

One particularly suitable design can be accomplished by making the beta of transistors Q1, ... Qn satisfy the criteria below:

$$\beta \geq C_L/C_B$$

As long as transistors Q1 ... Qn meet this condition they need not be well matched, although the ratio of overlap capacitance to base capacitance of all channels should be well-matched.

Additionally, it is desirable for the amount of charge coupled between the gate and source of transistors N1 ... Nn to be less than or equal to the amount of charge present on a given signal from CCD circuit 20. This criteria will minimize the importance of matching the ratio of $C_o/C_B$ among the various channels. Additionally, the ratio of $C_o/C_L$ should be minimized to maintain forward bias between the emitter and base of transistors Q1 ... Qn. Also a small $C_L$ is desirable because the operating speed of the circuit is maintained and only resonable transistor betas are required.

The circuit 40 can provide a voltage swing at comparator sense node input 61 of several volts, thereby greatly simplifying detection of the charge packets emerging on line 21a ... 21n. Additionally, circuit 40 operates very fast, having a set-up time typically less than 20 nanoseconds.

FIG. 2 shows a simplified cross-section of an integrated circuit for a single output line of FIG. 1, for example line 21b, from CCD device 20. The integrated circuit structure shown in FIG. 2 includes a substrate 50, typically p conductivity type silicon, and an insulating layer 51, typically silicon dioxide. Formed in substrate 50 is a first N type region 53 which serves as the base Q2B of transistor Q2 and as the source N2S of transistor N2. A second N type region 59 serves as the drain N2D of transistor N2. Input terminal $V_{OG}$ is shown connected to electrode 56, while input terminal $\theta$ is shown connected to electrodes 55 and N2G. Voltage $V_{DD}$ is applied to N type region 59.

The structure shown in FIG. 2 may be fabricated according to conventional semiconductor processing technology. One such process is as follows:

(1) Oxidize a p conductivity substrate 50 to form a layer 51 of silicon dioxide (not shown).
(2) Form polycrystalline silicon electrodes 55, 56 and 52.
(3) Mask and remove the silicon dioxide from those regions of the surface 57 of substrate 50 wherein n conductivity type regions for drain N2D and base Q2B (also source N2S) are to be formed, thereby leaving oxide regions 51a, 51b, and 51c.
(4) Diffuse or implant n type impurity into substrate 50 to form drain and base region 53.
(5) Form oxide 51 on surface 57.
(6) Mask and remove oxide 51 wherever p type regions 58 for emitter Q2E are desired.
(7) Diffuse or implant p type impurity 58 into substrate 50 through the openings formed in step (5).
(8) Mask and remove oxide 51 (if necessary) wherever ohmic contacts, e.g. for $V_{DD}$, are desired.
(9) Form ohmic contacts 54a and 54b for emitter Q2E and drain N2D, respectively.

Because it is desirable for the carriers, in this case, electrons, to have a long base lifetime, the bases of transistors Q1 . . . Qn should have base widths on the order of 0.5 microns and should not be heavily doped. A base impurity concentration of $10^{17}$ cm$^3$ has been found suitable. With the foregoing processes and controls, effective base capacitances on the order of 10fF are achievable after the emitter-to-base capacitance is precharged.

Of course the conductivity types and materials referred to with regard to FIG. 2 may be altered without departing from the scope of this invention. In particular, opposite conductivity types may be utilized and materials having an equivalent function may be substituted. Additionally, it may be advantageous to fabricate the structure of circuit 40 utilizing different types of semiconductor structures. For example, in certain applications it may be advantageous to formulate transistors Q1, . . . Qn using a lateral transistor structure rather than a vertical transistor structure as shown.

I claim:

1. A decoupling circuit for decoupling a comparator circuit from signals presented on a plurality of output lines wherein said decoupling circuit comprises:

a first plurality of transistors each having a first terminal connected to a different one of the output lines and each having a second terminal connected to the comparator circuit; and
a second plurality of transistors each having a first terminal connected to a different one of the first plurality of transistors.

2. A decoupling circuit as in claim 1 wherein each of the first plurality of transistors is a bipolar transistor.

3. A decoupling circuit as in claim 2 wherein the first terminal of each of the bipolar transistors is connected to the base of that bipolar transistor.

4. A decoupling circuit as in claim 2 wherein the second terminal of each bipolar transistor is connected to the emitter of that bipolar transistor and the emitters of the bipolar transistors are connected together and to the comparator circuit.

5. A decoupling circuit as in claim 1 wherein the first terminal of each of the second plurality of transistors is connected to the first terminal of a different one of each of the first plurality of transistors.

6. A decoupling circuit as in claim 5 wherein each of the first plurality of transistors is a bipolar transistor and each of the second plurality of transistors is an MOS transistor.

7. A decoupling circuit as in claim 6 wherein the first terminal of each of the bipolar transistors is connected to the base of that bipolar transistor and the first terminal of each of the MOS transistors is connected to one of the source and the drain of that MOS transistor.

8. A decoupling circuit as in claim 7 wherein the second terminal of each of the bipolar transistors is connected to the emitter of that bipolar transistor, and each of the second terminals of the bipolar transistors is connected together and connected to the comparator circuit.

9. A decoupling circuit as in claim 8 wherein each of the collectors of the plurality of bipolar transistors is connected to ground.

10. A decoupling circuit as in claim 8 wherein:
the base of each bipolar transistor is connected to the source of the corresponding MOS transistor, and
the drains of all the corresponding MOS transistors are connected to a source of electrical signals.

11. A structure as in claim 10 wherein:
the bipolar transistors are vertical pnp transistors, and
the MOS transistors are depletion-mode transistors.

* * * * *